(12) United States Patent
Deak, Sr.

(10) Patent No.: US 11,915,898 B2
(45) Date of Patent: *Feb. 27, 2024

(54) MAGNETIC MOMENTUM TRANSFER GENERATOR

(71) Applicant: WePower Technologies LLC, Sagaponack, NY (US)

(72) Inventor: David Deak, Sr., Head Of The Harbor, NY (US)

(73) Assignee: WEPOWER TECHNOLOGIES LLC, Sagaponack, NY (US)

( * ) Notice: Subject to any disclaimer, the term of this patent is extended or adjusted under 35 U.S.C. 154(b) by 323 days.

This patent is subject to a terminal disclaimer.

(21) Appl. No.: 17/443,418

(22) Filed: Jul. 26, 2021

(65) Prior Publication Data

US 2022/0020550 A1 Jan. 20, 2022

Related U.S. Application Data

(63) Continuation of application No. 16/173,341, filed on Oct. 29, 2018, now Pat. No. 11,251,007.
(Continued)

(51) Int. Cl.
| | |
|---|---|
| *H01H 51/10* | (2006.01) |
| *H03K 3/45* | (2006.01) |
| *H02K 35/02* | (2006.01) |
| *H02K 99/00* | (2014.01) |
| *H02K 1/34* | (2006.01) |

(52) U.S. Cl.
CPC ............... *H01H 51/10* (2013.01); *H02K 1/34* (2013.01); *H02K 35/02* (2013.01); *H02K 99/10* (2016.11); *H03K 3/45* (2013.01)

(58) Field of Classification Search
None
See application file for complete search history.

(56) References Cited

U.S. PATENT DOCUMENTS

| | | | |
|---|---|---|---|
| 1,711,323 | A | 4/1929 | Oglesby |
| 2,703,370 | A | 3/1955 | Johan |
| (Continued) | | | |

FOREIGN PATENT DOCUMENTS

| | | |
|---|---|---|
| CN | 201490855 U | 5/2010 |
| CN | 101895169 A | 11/2010 |
| (Continued) | | |

OTHER PUBLICATIONS

Extended European Search Report for EP Application No. 18874872.7 dated Jul. 8, 2021, 6 pages.
(Continued)

*Primary Examiner* — Jas A Sanghera

(57) ABSTRACT

A magnetic momentum transfer generator utilizes three or more magnets aligned with each other. A first control magnet is positioned outside a coil. A second magnet is positioned within the windings of the coil and a third magnet is positioned on the opposite side of the coil opposite the control magnet. When the control magnet rotated or moved, mutual magnetic flux lines generated by all three magnets and passing through the coil winding are aligned at right angles to the coil, thereby inducing a maximum voltage at the terminals. This generator is particularly useful for short burst radio micro-transmitters that can be used for batteryless and wireless switching applications.

20 Claims, 6 Drawing Sheets

Related U.S. Application Data

(60) Provisional application No. 62/578,612, filed on Oct. 30, 2017.

(56) References Cited

U.S. PATENT DOCUMENTS

| | | | |
|---|---|---|---|
| 3,027,499 A | 3/1962 | Holdway | |
| 3,218,523 A | 11/1965 | Eugene | |
| 3,315,104 A | 4/1967 | Barr | |
| 3,348,080 A | 10/1967 | Lair | |
| 3,398,302 A | 8/1968 | Hans-dieter et al. | |
| 3,500,082 A | 3/1970 | Tolegian | |
| 3,621,419 A | 11/1971 | Adams et al. | |
| 3,671,777 A | 6/1972 | Newell | |
| 3,673,999 A | 7/1972 | Lacy et al. | |
| 3,895,244 A | 7/1975 | Link | |
| 3,984,707 A | 10/1976 | Mcclintock | |
| 4,187,452 A | 2/1980 | Knappe et al. | |
| 4,257,010 A | 3/1981 | Bergman et al. | |
| 4,260,901 A | 4/1981 | Woodbridge | |
| 4,315,197 A | 2/1982 | Studer | |
| 4,363,980 A | 12/1982 | Petersen | |
| 4,412,355 A | 10/1983 | Terbrack et al. | |
| 4,471,353 A | 9/1984 | Cernik | |
| 4,521,712 A | 6/1985 | Braun et al. | |
| 4,703,293 A | 10/1987 | Ono et al. | |
| 4,752,706 A | 6/1988 | Meszaros | |
| 4,855,699 A | 8/1989 | Hoegh | |
| 4,866,321 A | 9/1989 | Blanchard et al. | |
| 4,870,306 A | 9/1989 | Petersen | |
| 5,053,659 A | 10/1991 | Parker | |
| 5,183,056 A | 2/1993 | Dalen et al. | |
| 5,204,570 A | 4/1993 | Gerfast | |
| 5,275,141 A | 1/1994 | Tsunoda et al. | |
| 5,499,013 A | 3/1996 | Konotchick | |
| 5,608,366 A | 3/1997 | Sako | |
| 5,708,406 A | 1/1998 | Tsunoda et al. | |
| 5,808,381 A | 9/1998 | Aoyama et al. | |
| 5,872,407 A | 2/1999 | Kitaoka et al. | |
| 5,990,583 A | 11/1999 | Nanba et al. | |
| 6,069,420 A | 5/2000 | Mizzi et al. | |
| 6,259,372 B1 | 7/2001 | Taranowski et al. | |
| 6,326,714 B1 | 12/2001 | Bandera | |
| 6,630,894 B1 | 10/2003 | Boyd et al. | |
| 6,659,176 B2 | 12/2003 | Mahadevaiah | |
| 6,700,310 B2 | 3/2004 | Maue et al. | |
| 6,720,681 B2 | 4/2004 | Hsiao | |
| 6,720,682 B2 | 4/2004 | Hatam-tabrizi et al. | |
| 6,879,076 B2 | 4/2005 | Long | |
| 7,015,778 B2 | 3/2006 | Fukushima et al. | |
| 7,021,603 B2 | 4/2006 | Wygnaski | |
| 7,026,900 B1 | 4/2006 | Gregory et al. | |
| 7,106,159 B2 | 9/2006 | Delamare et al. | |
| 7,151,332 B2 | 12/2006 | Kundel | |
| 7,315,098 B2 | 1/2008 | Kunita et al. | |
| 7,378,765 B2 | 5/2008 | Iwasa et al. | |
| 7,382,106 B2 | 6/2008 | Kundel | |
| 7,400,069 B2 | 7/2008 | Kundel | |
| 7,436,082 B2 | 10/2008 | Ruse et al. | |
| 7,495,656 B2 | 2/2009 | Yuba et al. | |
| 7,688,036 B2 | 3/2010 | Yarger et al. | |
| 7,710,227 B2 | 5/2010 | Schmidt | |
| 7,906,877 B2 | 3/2011 | Ishiyama et al. | |
| 7,906,920 B2 | 3/2011 | Imagawa | |
| 8,148,856 B2 | 4/2012 | Bataille et al. | |
| 8,299,659 B1 | 10/2012 | Bartol, Jr. | |
| 8,330,283 B2 | 12/2012 | Lin | |
| 8,514,040 B2 | 8/2013 | Gruner | |
| 8,539,765 B2 | 9/2013 | Miller | |
| 8,624,447 B2 | 1/2014 | Cartier Millon et al. | |
| 8,629,572 B1 | 1/2014 | Phillips | |
| 8,633,604 B2 | 1/2014 | Miller | |
| 8,633,605 B2 | 1/2014 | Tinto et al. | |
| 8,729,747 B2 | 5/2014 | Arnold et al. | |
| 8,773,226 B2 | 7/2014 | Li et al. | |
| 8,816,557 B2 | 8/2014 | Long et al. | |
| 8,907,505 B2 | 12/2014 | Fortier et al. | |
| 9,303,628 B2 | 4/2016 | Fortier et al. | |
| 9,343,931 B2 | 5/2016 | Deak et al. | |
| 9,543,817 B2 | 1/2017 | Deak, Sr. | |
| 9,673,683 B2 | 6/2017 | Deak, Sr. | |
| 9,843,248 B2 | 12/2017 | Deak, Sr. | |
| 9,923,443 B2 | 3/2018 | Deak, Sr. | |
| 10,270,301 B2 | 4/2019 | Deak, Sr. | |
| 10,348,160 B2 | 7/2019 | Deak, Sr. | |
| 10,396,642 B2 | 8/2019 | Petrick | |
| 10,523,098 B1 | 12/2019 | Bowen | |
| 10,707,706 B2 | 7/2020 | Yu | |
| 10,855,158 B2 | 12/2020 | Hwang et al. | |
| 11,251,007 B2 * | 2/2022 | Deak, Sr. | H02K 7/1853 |
| 2001/0045785 A1 | 11/2001 | Chen et al. | |
| 2002/0070712 A1 | 6/2002 | Arul | |
| 2002/0130561 A1 | 9/2002 | Temesvary et al. | |
| 2002/0190610 A1 | 12/2002 | Andre et al. | |
| 2003/0025416 A1 | 2/2003 | Sullivan et al. | |
| 2003/0155771 A1 | 8/2003 | Cheung et al. | |
| 2003/0197433 A1 | 10/2003 | Cheung et al. | |
| 2004/0051416 A1 | 3/2004 | Yamada et al. | |
| 2004/0078662 A1 | 4/2004 | Hamel et al. | |
| 2004/0124729 A1 | 7/2004 | Long | |
| 2004/0128781 A1 | 7/2004 | Kunita et al. | |
| 2004/0174287 A1 | 9/2004 | Deak | |
| 2004/0222709 A1 * | 11/2004 | Naganuma | G03B 9/14 310/36 |
| 2005/0006961 A1 | 1/2005 | Shen | |
| 2005/0023905 A1 | 2/2005 | Sakamoto | |
| 2005/0168108 A1 | 8/2005 | Face | |
| 2005/0280316 A1 | 12/2005 | Nozawa et al. | |
| 2006/0175923 A1 | 8/2006 | Abou et al. | |
| 2006/0234669 A1 | 10/2006 | Rode | |
| 2006/0237968 A1 | 10/2006 | Chandrasekaran | |
| 2006/0244316 A1 | 11/2006 | Kundel | |
| 2006/0244327 A1 | 11/2006 | Kundel | |
| 2006/0267418 A1 | 11/2006 | Kundel | |
| 2008/0048506 A1 | 2/2008 | Deak | |
| 2008/0079319 A1 | 4/2008 | Ishiyama et al. | |
| 2008/0211435 A1 | 9/2008 | Imagawa | |
| 2011/0001381 A1 | 1/2011 | Mcdaniel | |
| 2011/0140563 A1 | 6/2011 | Beranger | |
| 2011/0254285 A1 | 10/2011 | Hanchett, Jr. | |
| 2011/0273052 A1 | 11/2011 | Long et al. | |
| 2012/0104765 A1 | 5/2012 | Tinto et al. | |
| 2012/0133234 A1 | 5/2012 | Da | |
| 2013/0033042 A1 | 2/2013 | Fortier et al. | |
| 2013/0088018 A1 | 4/2013 | Kobayashi | |
| 2013/0093540 A1 | 4/2013 | Ruff | |
| 2013/0127268 A1 | 5/2013 | Atherton | |
| 2013/0342037 A1 | 12/2013 | Kawarai et al. | |
| 2014/0246961 A1 | 9/2014 | Smith | |
| 2014/0375164 A1 | 12/2014 | Deak et al. | |
| 2015/0015104 A1 | 1/2015 | Kataoka et al. | |
| 2015/0076832 A1 | 3/2015 | Fortier et al. | |
| 2015/0091395 A1 | 4/2015 | Spivak | |
| 2015/0091479 A1 | 4/2015 | Spivak | |
| 2015/0279598 A1 | 10/2015 | Matsumoto et al. | |
| 2015/0357893 A1 | 12/2015 | Deak, Sr. | |
| 2016/0134173 A1 | 5/2016 | Deak, Sr. | |
| 2016/0204665 A1 | 7/2016 | Deak, Sr. | |
| 2016/0359401 A1 | 12/2016 | Deak, Sr. | |
| 2017/0077794 A1 | 3/2017 | Deak, Sr. | |
| 2017/0346377 A1 | 11/2017 | Deak, Sr. | |
| 2018/0145561 A1 | 5/2018 | Deak, Sr. | |
| 2019/0131098 A1 | 5/2019 | Deak, Sr. | |
| 2021/0143719 A1 | 5/2021 | Deak, Sr. | |
| 2022/0416635 A1 | 12/2022 | Deak et al. | |
| 2023/0137951 A1 | 5/2023 | Deak, Sr. | |

FOREIGN PATENT DOCUMENTS

| | | |
|---|---|---|
| CN | 203166718 U | 8/2013 |
| CN | 106992649 A | 7/2017 |
| DE | 3218181 A1 | 11/1983 |
| DE | 102006013237 A1 | 10/2007 |
| DE | 102010017874 A1 | 10/2011 |
| EP | 0948018 A2 | 10/1999 |

(56) References Cited

FOREIGN PATENT DOCUMENTS

| | | |
|---|---|---|
| EP | 1936787 A1 | 6/2008 |
| EP | 2079154 A2 | 7/2009 |
| EP | 2178738 A1 | 4/2010 |
| EP | 2272742 A1 | 1/2011 |
| EP | 2834907 A1 | 2/2015 |
| EP | 3059850 A1 | 8/2016 |
| EP | 3215726 A1 | 9/2017 |
| EP | 3704785 A1 | 9/2020 |
| JP | H11264368 A | 9/1999 |
| JP | 2009261204 A | 11/2009 |
| JP | 2011130654 A | 6/2011 |
| WO | 9628873 A1 | 9/1996 |
| WO | 0122587 A1 | 3/2001 |
| WO | 0237516 A2 | 5/2002 |
| WO | 2009015910 A1 | 2/2009 |
| WO | 2013031127 A1 | 3/2013 |
| WO | 2013035057 A2 | 3/2013 |
| WO | 2013151631 A1 | 10/2013 |
| WO | 2016074003 A1 | 5/2016 |
| WO | 2017086886 A2 | 5/2017 |
| WO | 2019089435 A1 | 5/2019 |
| WO | 2021102316 A1 | 5/2021 |

OTHER PUBLICATIONS

Extended supplementary European Search Report issued in European Application No. 13772599.0, dated Oct. 31, 2016, 19 pages.
https://www.google.com/search ?q=mag netic+interaction&biw=1 920&bih=1115&source=1 nms&tbm=isch&sa=X& ved=OahU KEwjby5SLtuHKAhUCOWMKHaQUDb4Q_AUIBigB#imgrc= rCMVDdr681uSXM%3A,.
International Preliminary Report on Patentability received for PCT International Application No. PCT/US2018/057957, dated May 14, 2020, 5 pages.
International Search Report and Written Opinion for PCT Application No. PCT/US2020/061590, dated Feb. 25, 2021, 11 pages.
International Search Report received for PCT Patent International Application No. PCT/US2007/017325, dated Aug. 7, 2008, 8 pages.
International Search Report received for PCT Patent International Application No. PCT/US2018/057957, dated Feb. 25, 2019, 6 pages.
Office Action issued in European Application No. 13772599.0, dated Jun. 30, 2017, 12 pages.
Office Action issued in European Application No. 13772599.0, dated Nov. 17, 2017, 4 pages.
Partial supplementary European Search Report issued in European Application No. 13772599.0, dated Jul. 1, 2016, 7 pages.
U.S. Appl. No. 13/775,461, filed Feb. 25, 2013, Electrical Generator with Rotational Gaussian Surface Magnet and Stationary Coil.
U.S. Appl. No. 14/715,971, filed May 19, 2015, Hollow Magnetic Metal Core Pulse Energy Harvesting Generator.
U.S. Appl. No. 15/,363,335, filed Nov. 29, 2016, Hollow Magnetic Metal Core Pulse Energy Harvesting Generator.
U.S. Appl. No. 14/535,498, filed Nov. 7, 2014, Reciprocating Magnet Electrical Generator.
U.S. Appl. No. 14/730,714, filed Jun. 4, 2015, Rocker Action Electric Generator.
U.S. Appl. No. 15/074,551, filed Mar. 18, 2016, Electrical Generator with Rotational Gaussian Surface Magnet and Stationary Coil.
U.S. Appl. No. 15/602,167, filed May 23, 2017, Tangentially Actuated Electrical Generator.
U.S. Appl. No. 15/358,625, filed Nov. 22, 2016, Rotationally Activated Generator.
U.S. Appl. No. 10/718,308, filed Nov. 20, 2003, Self-Contained Switch.
U.S. Appl. No. 11/890,112, filed Aug. 3, 2007, Electromotive Device.
U.S. Appl. No. 16/173,341, filed Oct. 29, 2018, Magnetic Momentum Transfer Generator.
EP 13772599.0, Feb. 26, 2013, An Electrical Generator with Rotational Gaussian Surface Magnet and Stationary Coil.
EP 15857253.7, Dec. 28, 2015, Reciprocating Magnet Electrical Generator.
PCT/US18/57957, Oct. 29, 2018, Magnetic Momentum Transfer Generator.
CN 201880080434.3, Oct. 29, 2018, Magnetic Momentum Transfer.
EP 18874872.7, Oct. 29, 2018, Magnetic Momentum Transfer Generator.
U.S. Appl. No. 17/149,396, filed Jan. 14, 2021, Tangentially Actuated Electrical Generator.

* cited by examiner

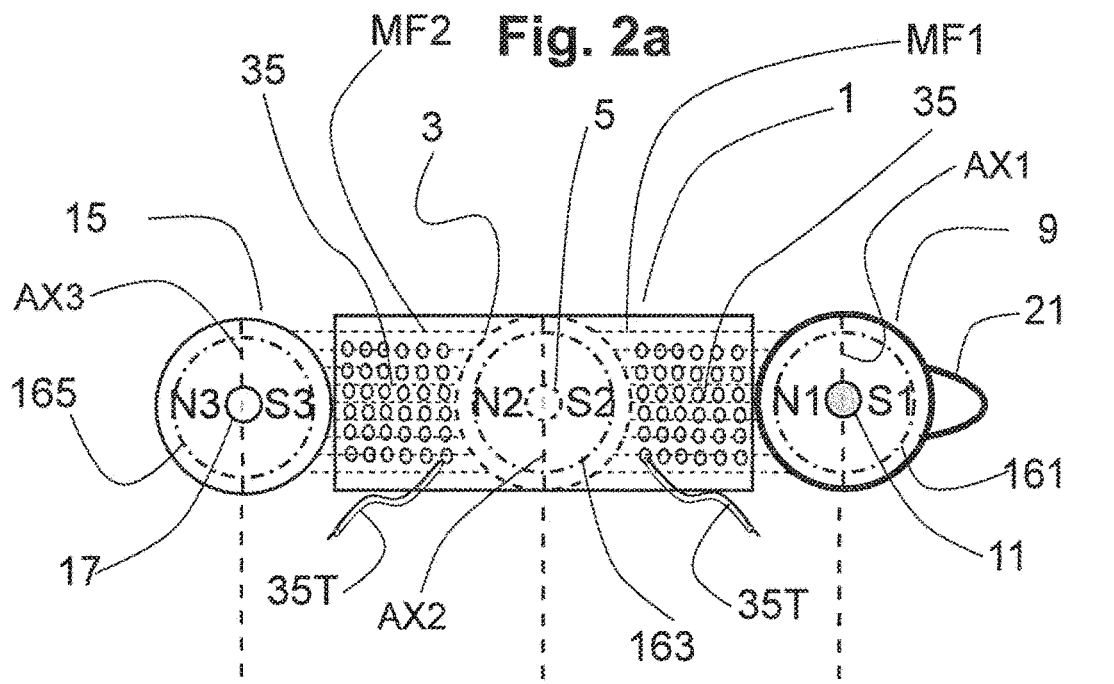
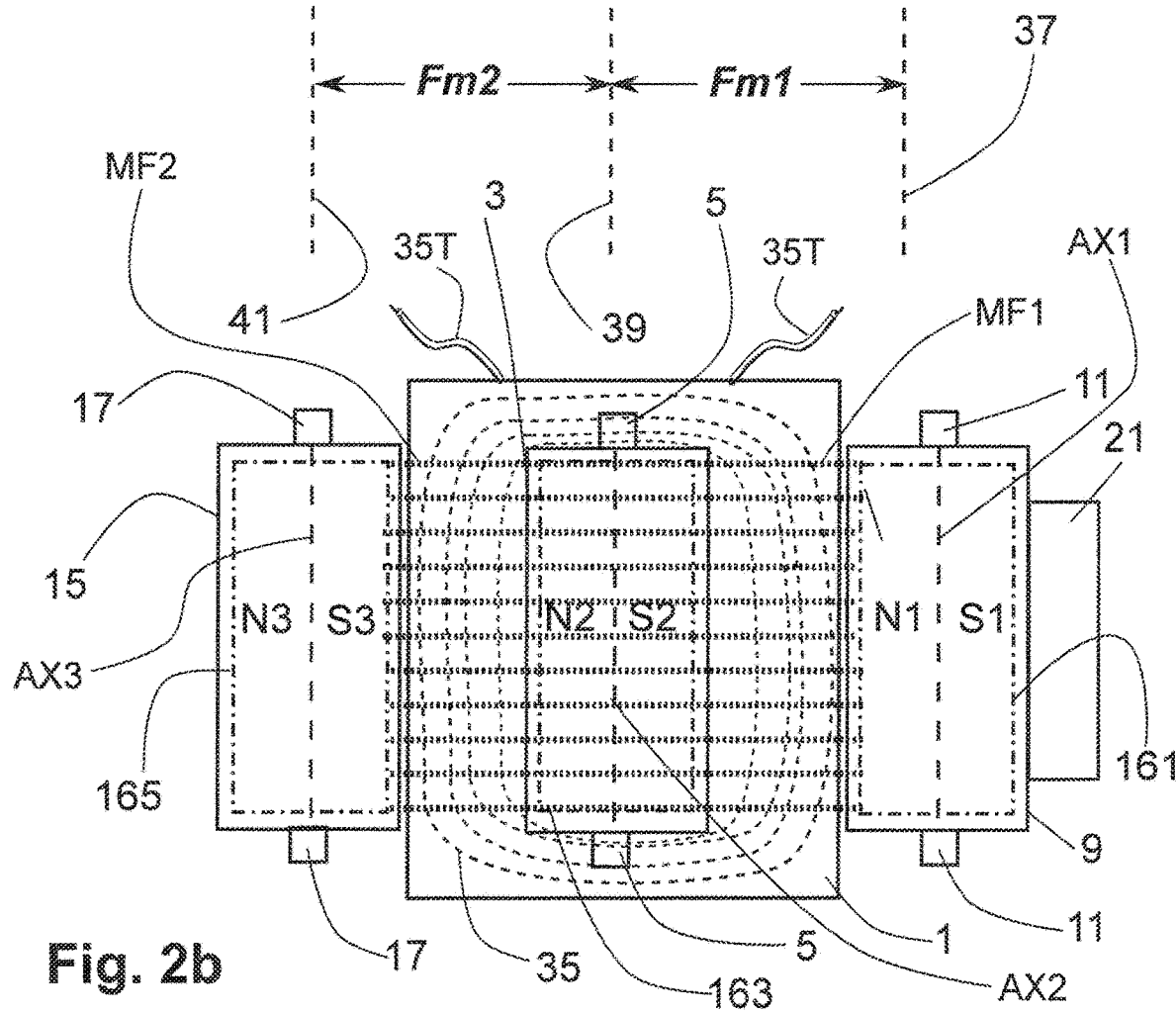

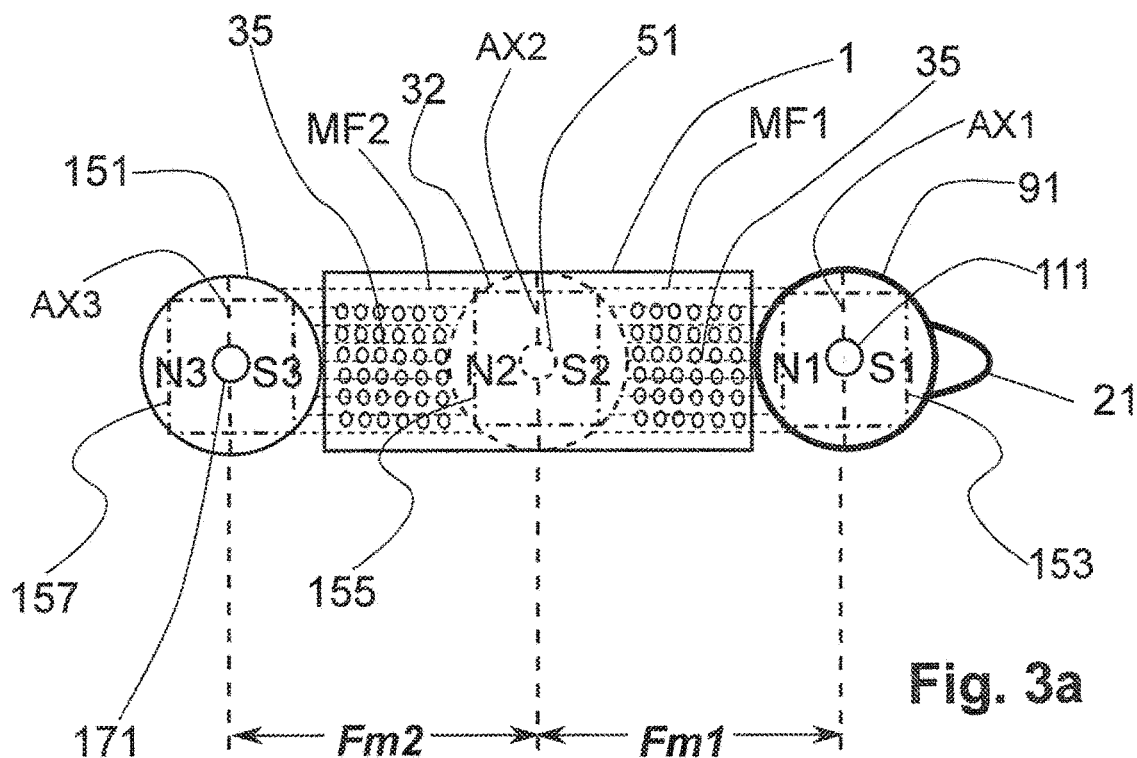
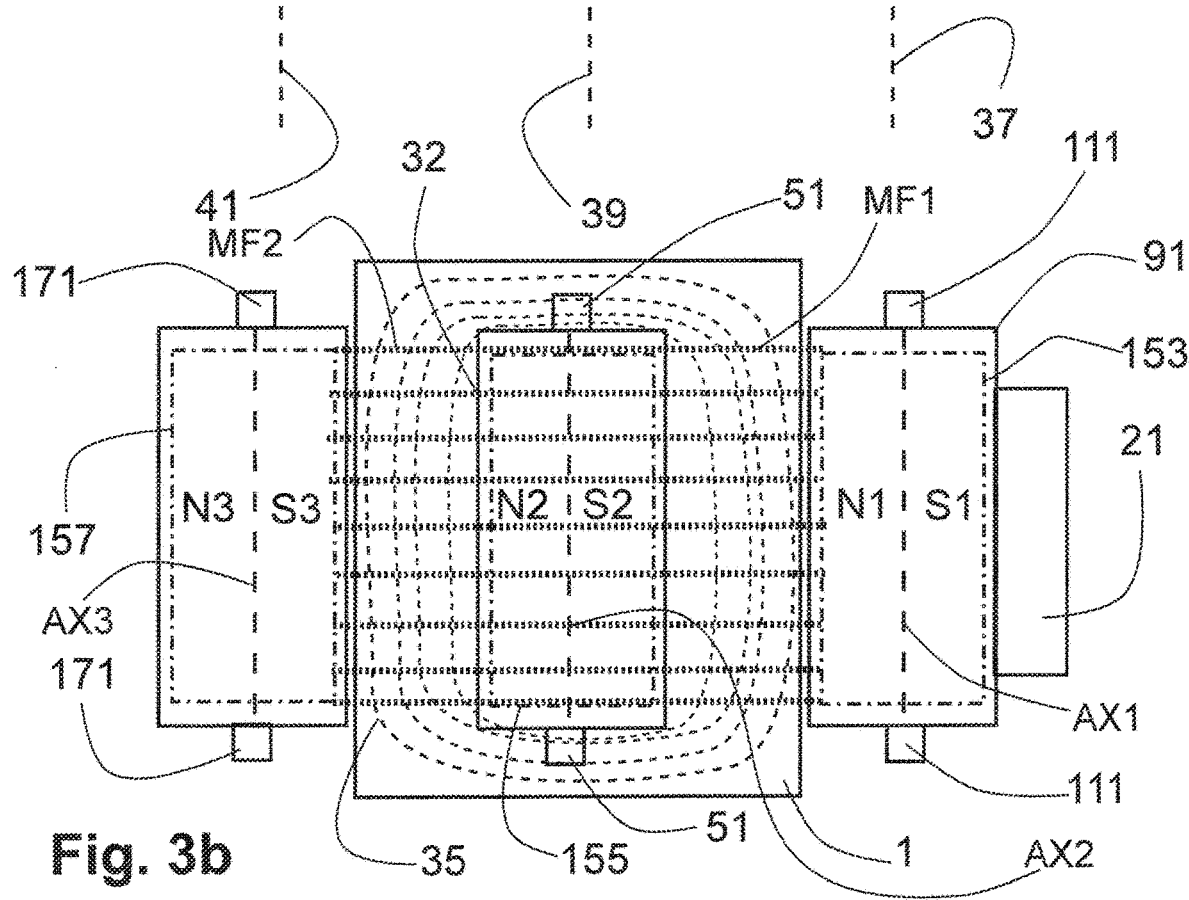

MAGNETIC MOMENTUM TRANSFER GENERATOR

CROSS-REFERENCE TO RELATED APPLICATIONS

The present application is a continuation of U.S. patent application Ser. No. 16/173,341 filed Oct. 29, 2018, and entitled "MAGNETIC MOMENTUM TRANSFER GENERATOR," the contents of which are hereby incorporated by reference in their entirety. U.S. patent application Ser. No. 16/173,341 claims the benefit of priority under 35 U.S.C. § 119 to U.S. Provisional Application No. 62/578,612, filed Oct. 30, 2017, and entitled "MAGNETIC MOMENTUM TRANSFER GENERATOR".

BACKGROUND OF THE INVENTION

A long invention history of prior art is based around Faraday's Law and Lenz's Law of electromagnetic induction for producing electrical power by applications of electrical generators based on these laws. The size and sophistication of these devices have been enhanced and made more predictable to reduce size with increase power by the advent of rare earth magnets such as Neodymium types. The present invention in its novelty takes advantage of these improvements and utilizes novel designs to reduce size with generating enough power and with enough time duration to power short burst radio micro-transmitters that can be used for battery-less and wireless switching applications that have operating frequencies that are within the allowable bandwidths and durations associated with ISM Band FCC approved short burst radio transmission.

SUMMARY OF THE INVENTION

One of the intents of this invention is to teach that, by utilizing the intensified magnitude of the magnetic flux of rare earth magnets such as Neodymium, but not limited to conventional Neodymium magnet structures, is that electrical energy by a novel arrangement of a plurality of magnets disposed within and around a coil can produce electrical power. One embodiment of this invention is having disposed three cylindrical magnets, but not limited to cylindrical magnets, that are diametrically poled North and South (such that on one half of each cylinder magnet there exists a North pole and on the opposite side of each cylinder magnet a South pole exists), and where classically intrinsic magnetic flux lines are formed from exiting the North pole and entering the South pole to form closed loops of magnetic lines of force, whose field intensity varies mathematically as the reciprocal of the cube of the distance ($1/d^3$) away from each pole to any point beyond the pole in an omnidirectional paradigm, and whose instant effect are resultant three dimensional tensors with a defined set of basis vectors.

Another intention of this invention is to teach that by utilizing the intensified magnitude of the magnetic flux of rare earth magnets such as Neodymium, but not limited to conventional Neodymium magnet structures, is that electrical energy by a novel arrangement of a plurality of magnets disposed within and around a coil can produce electrical power. Another embodiment of this invention is having disposed three rectangular (non-cylindrical) magnets, but not limited to three rectangular (non-cylindrical) magnets, that are diametrically poled North and South such that on one half of each of the three rectangular (non-cylindrical) magnets there exists a North pole and on the opposite side of this three rectangular (non-cylindrical) magnet a South pole exists and where classically intrinsic magnetic flux lines are formed from exiting the North pole and entering the South pole to form closed loops of magnetic lines of force, whose field intensity varies mathematically as the reciprocal of the cube ($1/d^3$) of the distance away from each pole to any point beyond the pole in an omnidirectional paradigm, and whose instant effect are resultant three dimensional tensors with a defined set of basis vectors.

Another intention of the present invention is to teach that precise alignment of three separate magnets of choice that are in-line with each other, in assembly, that are disposed as the first magnet (active master control magnet) that is diametrically poled and is free to rotate on its axis, but not limited to diametric poling and could be axially poled, is identified as the master control rotatable magnet and is disposed abut to the outside of a coil that is wound either clockwise or counter-clockwise in a two-dimensional X-Y plane with an accumulated wound depth in the Z plane. The abutment of the first control magnet to one of the outside regions of the coil is to obtain the maximum magnetic flux lines per square area.

There also exists in this three-magnet assembly, a second magnetically coupled rotation dependent magnet of choice that is in-line and is centered within the coil and is free to rotate on its axis of rotation; and this second magnet is identified as the first magnetically dependent magnet, whose rotation within the coil is dependent on the instant rotation of the first master control magnet. Ergo, any rotational change in the first master control magnet magnetically and rotationally influences the second magnetically coupled rotation dependent magnet within the coil.

There also exists in this three-magnet in-line assembly, a third magnet of choice that is in-line and disposed abut on the opposite inline side of the coil relative to the first abutted master control magnet. This third magnetically coupled rotation dependent magnet is disposed about the coil's outside wound region.

The complete operation of the three rotational magnet in-line assembly is that when a finger of a user, or another external object, swipes a toggle paddle of an enclosure containing the first master control magnet that is disposed within the enclosure, the first master control magnet rotates momentarily. All three in-line assembly magnets are designed and situated so that they are all magnetically coupled, and all three magnets are pole positioned and in-line attractive so that the poles of each magnet faces a neighboring opposite magnetic pole. The example arrangement is: the first magnet with its North and South poles face North to South attractive to the second magnet, and the second magnet with its North and South poles face North to South attractive to the third magnet. When the first master control magnet rotates counter-clockwise, the second magnet within the coil rotates clockwise, and instantly the third magnet rotates in the counter-clockwise direction; and when the first master control magnet moves clockwise, the second magnet within the coil moves counter-clockwise, and the third magnet moves clockwise.

During a triggering of the toggle paddle enclosure that the first master control magnet is contained in, the magnet rotates in either a clockwise or counter-clockwise rotation, inducing a voltage across the end terminals of the coil because the action of the first master control magnet's movement has its intrinsic magnetic field attracted with field lines between the first magnet's North pole and second magnets South pole and the field lines of the second magnet's North pole and third magnets South pole, which provides changes in the magnetic field intensity within the coil and by Faraday's Law induces a voltage across the end terminals of the coil. The angular displacement is not limited to 0-45 degrees of rotation, the range can vary from 0 to 90 degrees; and in other embodiments here could be a complete 360-degree rotation for singular displacement, displacement with periodic rotate start and rotate stop with varying time durations or continuous periodic rotation for long durations.

In accordance with Faraday's Law of induction, which is a basic law of electromagnetism, predicting how a magnetic field will interact with an electric circuit (coil) to produce an electromotive force ∈ (EMF, voltage)—a phenomenon called electromagnetic induction;

$$\in = -N\frac{\partial \emptyset}{\partial t} \text{ the } N \text{ represented the number of turns in the coil.} \quad \text{Eq. 1}$$

And Lenz's Law, which states that the current induced in a circuit due to a change or a motion in a magnetic field is so directed as to oppose the change in flux and to exert a mechanical force opposing the motion.

Ergo, Faraday's Law describes the induced voltage across the coil end terminals, and Lenz's Law describes not only the induced voltage but also the magnetic force that acts like magnetic force springs in the present invention.

Lenz's law is shown by the negative sign in Faraday's law of induction:

$$\in = -\frac{\partial \emptyset}{\partial t} \quad \text{Eq. 2}$$

which indicates that the induced EMF ∈ and the change in magnetic flux $$-\frac{\partial \emptyset}{\partial t} \quad \text{Eq. 3}$$

have opposite signs. It is a qualitative law that specifies the direction of induced current but says nothing about its magnitude; that is described by Faraday's Law.

Lenz's law explains the direction of many effects in electromagnetism, such as the direction of voltage induced in an inductor or wire loop by a changing current, or why eddy currents exert a drag force on moving objects in a magnetic field; the present invention utilizes the drag force in addition to the primary source of spring action provided by the attractive forces summed between the first rotatable master control magnet and the second servant rotatable center disposed in coil magnet, and the second servant rotatable center disposed in coil magnet and the third rotatable servant magnet; and also to act as spring action on the master control magnet to cause it to back rotate upon its initial forward movement caused by an external applied force. If the initial external applied force on the master control magnet is forward (clockwise), the eddy current in the coil plus the summed attractive forces of the magnetic fields encompassed all magnets momentarily repels the master control magnet backward (counter-clockwise); and if the external applied force on the master control magnet is backward (counter-clockwise), the eddy current in the coil plus the summed attractive forces of the magnetic fields surrounding all magnets momentarily repels the master control magnet forward.

The combination of all three magnets and their associated encompassed magnetic fields that pass through the coil winding represents the total magnetic flux field Ø and the rate at which the master control rotatable magnet is triggered determines the amount of the induced voltage (EMF, ∈) stated mathematically as:

$$\in = -N\frac{\partial \emptyset}{\partial t} \quad \text{Eq. 4}$$

In the present embodiment the operation of the generator can be of two different modes. In the first mode the operation is a total reciprocating rotational movement of the first master control magnet made to function this way by keeping the third servant magnet in a non-rotational state; this feature establishes a momentarily non-latched state for the toggling of the first master control magnet, so when it is triggered by the tangent toggle actuator, the first magnet oscillates for a few cycles before friction from the axles of the magnet diminishes motion.

In the second mode of the present embodiment the operation of the generator can be made to act in a stayed state condition whereby if the third servant magnet is free to rotate, then when the first master control magnet is flipped by an external force, as its North pole is rotated clockwise the second servant center magnet will turn in the opposite direction counter-clockwise so that its South pole faces the first magnets North pole; and the third servant will turn in the clockwise direction so that its South pole faces the North pole of the second servant magnet and will hold the second center magnet in that locked position and so the first master control magnet will be cocked and locked until an external force is applied to un-cock and un-lock the first magnet and remain in the new state until acted upon in the opposite state; otherwise known as a FLIP-FLOP device or toggle switch. In each mode electrical energy is produced.

The present invention can be of a plurality of magnet configurations and plurality of magnet placements, and these placements as described are not limited to in-line, and could be non-in-line.

Another embodiment of the present invention could be with diametrically poled elongated polygon magnets; and another embodiment could be with axially poled cylinder magnets; and another embodiment could be with axially poled polygon magnets.

In all embodiments of the present invention where all three magnets are in any configuration and all here are free to rotate, all three of these magnets are set into rotational motion simultaneously by action of the attractive interlinking of their respective magnetic fields. In all embodiments of the present invention where the third servant magnet is fixed and not free to rotate, the remaining two magnets are free to rotate and do so simultaneously by action of the attractive interlinking of their respective magnetic fields.

With the present invention in a plurality of embodiments, the common factors that describe the mathematical signature of all possible embodiments envisioned that produce electrical energy are; (1) the effects of intrinsic residual magnetic pole field intensity of each magnet, (2) the distance between magnets, (3) the number of turns in the coil, and (4) the gauge of the wire (as a current limiting factor associated with the wire's internal specific resistance). This mathematical signature further describes the amplitude of the induced voltage, the current limiting, and the frequency of the induced voltage that has a damped sinusoidal or near sinusoidal waveform. The intensity of the magnetic pole field is directly proportional to the induced voltage.

BRIEF DESCRIPTION OF THE DRAWINGS

The present inventions may be better understood in accordance with the following exemplary figures, in which:

FIGS. 2A and 2B are drawings showing an embodiment of three in-line cylinder magnets and their effective summed attractive magnetic fields;

FIG. 3A is a drawing showing another embodiment of three in-line rectangular-bar magnets and their effective summed attractive magnetic fields that penetrate through the coil winding;

FIG. 3B is a top view showing the in-line arrangement of the three-rotatable elongated rectangular bar magnets of FIG. 3A;

DETAILED DESCRIPTION

Figure 1A:
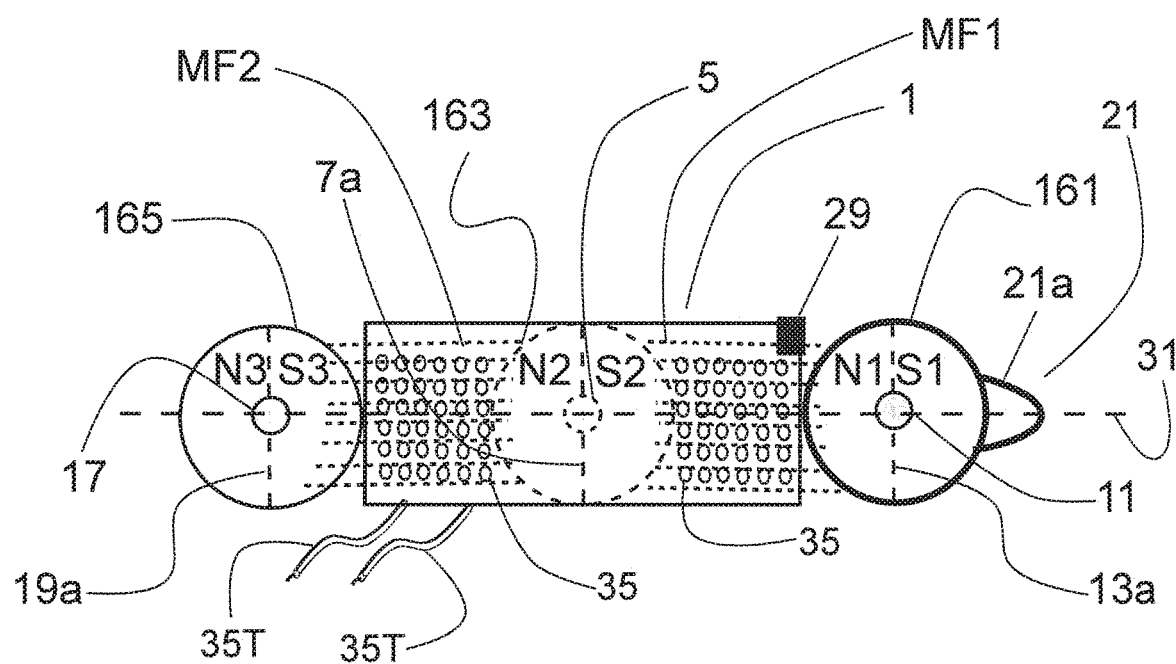
FIG. 1A is a drawing of an arrangement of three in-line cylinder magnets and their respective pole alignment in a state of combined magnetic equilibrium.

In FIG. 1A, what is illustrated is the basic in-line arrangement of three cylinder magnets 161, 163, and 165, where there is a first magnet 161 (motion active) that is free to rotate on its axles of rotation 11 with its combined magnetic field lines (static) MF1 parallel to the horizontal plane that acts as the master control magnet for mutual motion when generated by an external applied force.

In FIG. 1A, there is a second magnet 163 that is disposed within the center of the coil 1 and acts as a servant (magnetically coupled) magnet that is free to rotate on its axles of rotation 5 and having magnetic poles N2 and S2. The second magnet 163 is under the mutual attractive combined magnetic field (static) MF1 that exists between the first magnet 161 and the second magnet 163.

Also, in FIG. 1A there is a third in-line servant (magnetically coupled) magnet 165 that is in a fixed position with its poles aligned so that its magnetic poles N3 and S3 are non-rotatable and fixed and aligned with the mutual attractive combined magnetic field MF2 parallel to the horizontal plane between the third magnet 165 and the second magnet 163.

FIG. 1A represents a static equilibrium state whereby there is no external force that is applied to the toggle paddle 21 and is in a rest position 21a, and each in-line magnet has its respective pole aligned with each pole pair in an attractive magnetic field state with the direction of the permeation of the combined mutual fields parallel to the horizontal plane.

In this static equilibrium state, here is no motion and thereby no electrical energy produced at the coil terminal ends 35T, in accordance with Faraday's Law.

Figure 1B:
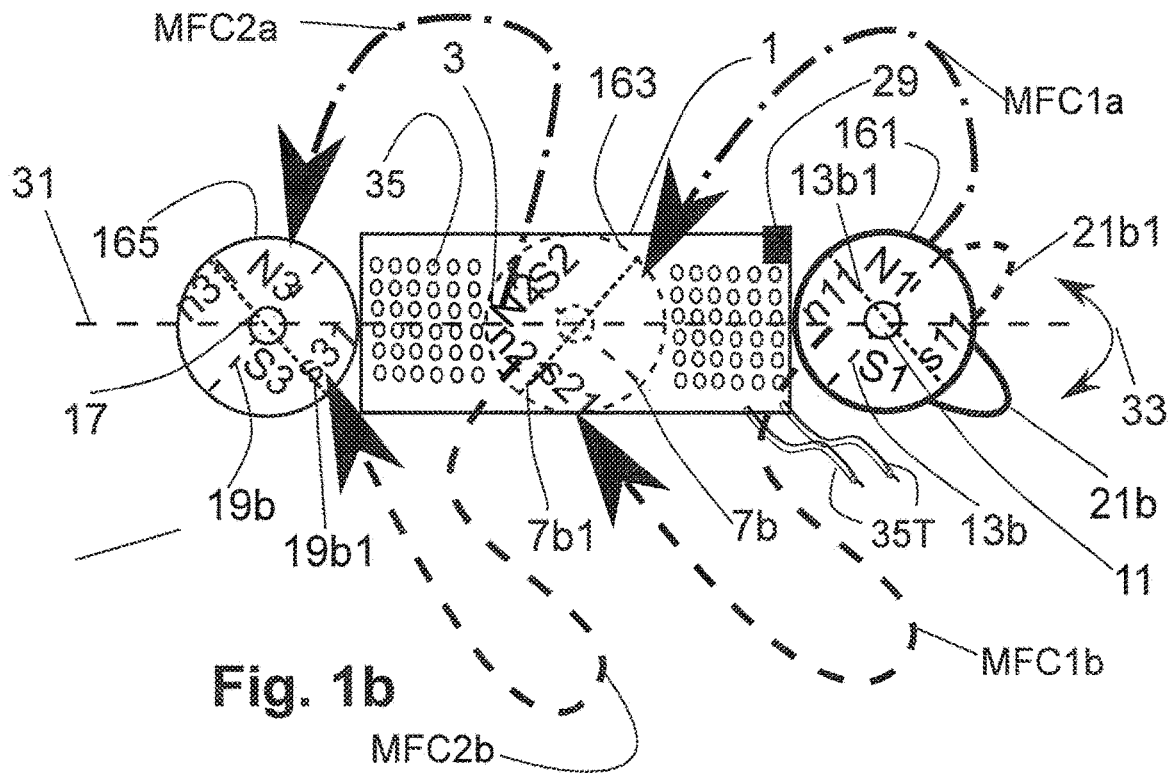
FIG. 1B is a drawing of an arrangement of three in-line cylinder magnets and their respective pole alignment in a state of combined magnetic non-equilibrium.

FIG. 1B shows the operation of changing movement states of the first master control magnet 161 when an external force is applied. FIG. 1A shows the no-force applied-state with the toggle paddle 21 and in this embodiment the toggle paddle 21 is at rest position 21a in the horizontal plane 31. When an external force (a finger, moving object, lever from a trip-counter and any other foreign object offering an mechanical interference force to cause movement) is applied instantly to the toggle paddle 21 and it momentarily moves to a new position 21b, having been triggered with a flicking motion. The force briefly comes in mechanical contact with the toggle paddle 21 and is removed instantly so that it does not impede the natural damped oscillatory cycling for a short time between the toggle paddle position 21b1 and the toggle paddle position 21b, before coming to rest by frictional forces and during this time of oscillation, and a damped sine wave voltage is felt at the coil terminals 35T. Another feature of this present invention is the mutual attractive magnetic field force (static) (that exists between first master control magnet 161 that is rotatable and second magnet 163 in the role of servant [magnetically coupled] magnet 163 that is rotatable) and the mutual attractive magnetic field force (that exists between second magnet 163 in the role of servant [magnetically coupled] magnet and third magnet 165 in the role of servant [magnetically coupled] magnet that is rotatable) that establishes a natural spring action and eliminates any need for mechanical springs.

Figure 1C:
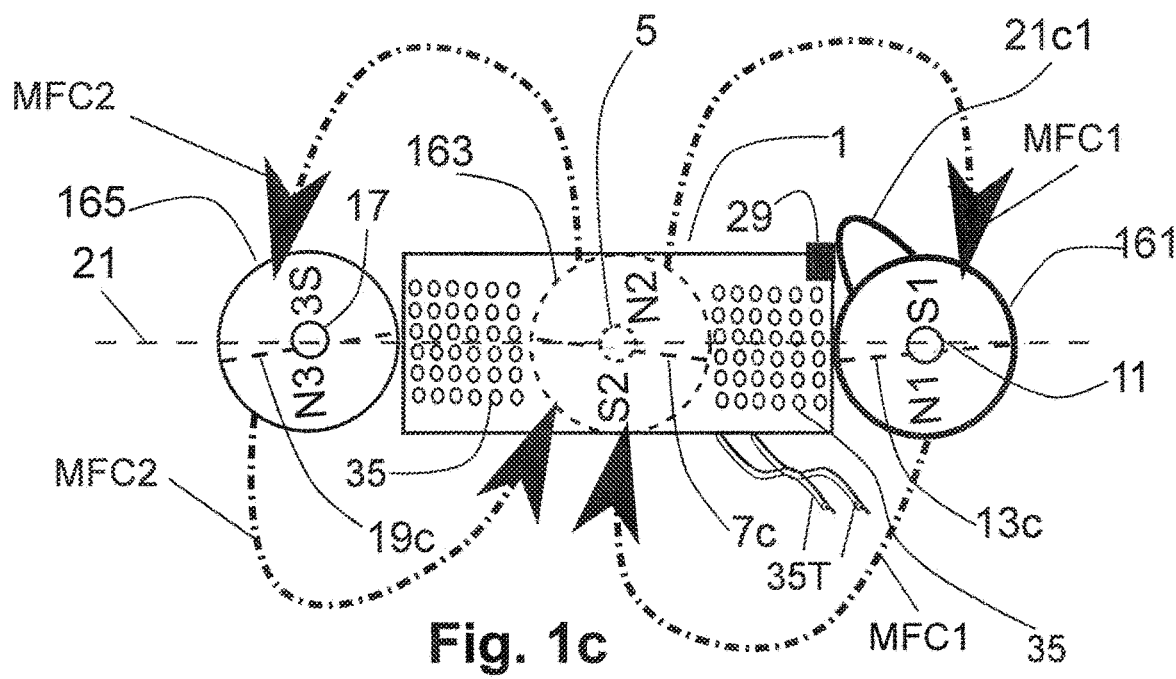
FIG. 1C is a drawing of an arrangement of three in-line cylinder magnets and their respective pole alignment in a state of combined magnetic non-equilibrium.

FIG. 1C is another embodiment of the invention where this embodiment is activated and remains in a position latched state 21c1, where there are two possible stable states, as indicated by the prefix "bi" in its name. Typically, one state is referred to as SET and the other as RESET. The simplest bi-stable device, therefore, is known as a set-reset, or S-R, latch (its electrical equivalent).

In FIG. 1C, the toggle paddle 21 that is part of the first master control magnet 161, when pushed to an active position 21c1 that is greater than a 90-degree counter-clockwise angular displacement where it is abut to a fixed stop-span 29 the first master control magnet 161 and its toggle paddle component will rest at the stop-span 29 and is latched in that mechanical SET state by the action of all three in-line rotatable magnets and their associated attractive magnetic force fields (active with motion) MFC1 and MFC2. This latched state is caused by the toggle paddle 21 coming to rest abut with the stop-span and with that action all three of the magnets 161, 163, 165 have their poles aligned as follows: the North Pole of first magnet 161 (N1) in a vertical down position, the North Pole of the second magnet 163 (N2) aligned in a vertical up position, and the North Pole of the third magnet 165 (N3) aligned in a vertical down position, which combined is in an attractive magnetic field state. Pushing the toggle paddle 21 away from the stop-span 29 causes all three magnets to flip their states aligned as first magnet 161 North Pole in a vertical up state, second magnet 163 North Pole in a vertical down state, and the third magnet 165 North Pole in a vertical up state and the first master control magnet 161 returns to its rest position in the horizontal plane 31.

In the side view of FIG. 2A the three cylindrical magnets that are diametrically poled 161, 163, 165 are shown disposed within respective encapsulated non-magnetic enclosures 9, 3, 15 that have axles of rotation 11, 5, 17 respectively and are disposed on each side of the non-magnetic enclosures 9, 3, 15. In a rest state, which is the case in FIG. 2A, there are mutual magnetic flux lines that emanate from the North Pole N1 of first magnet that is the rotatable master control magnet 161 and is disposed within its enclosure 9 to the South Pole S2 of second servant [magnetically coupled] rotatable magnet 163 and is disposed within its enclosure 3. The North Pole N2 of second servant [magnetically coupled] magnet 163 has its mutual magnetic flux lines that emanate from the second magnet's North Pole N2 to the South Pole S2 of third magnet 165.

In addition, it is recognized that there is a set of two mutual forces of physical attraction measured in Newtons. The first mutual attraction physical force Fm1 is between first magnet 161 and the second magnet 163; and the second mutual attraction physical force Fm2 is between second magnet 163 and third magnet 165.

FIG. 2B is a top view showing the in-line arrangement of the three rotatable magnets 161, 163, 165. First magnet 161 is disposed within its enclosure 9 and the enclosure has a set of axles in-line with the first magnet's imaginary reference axis AX1 where on each side of each of the three in-line magnets there exists three individual imaginary reference axis AX1, AX2, & AX3, where there is the North Pole on one side of each magnet and the South Pole on the opposite side of each magnet; as shown in FIG. 2A & FIG. 2B.

In FIG. 2A & FIG. 2B the coil winding 35 (on a coil bobbin) is illustrated and the mutual magnetic flux (field) lines MF1 & MF2 pass through each of the three in-line magnets 161, 163, 165; and when any motion is initiated by a disturbance (movement, triggering by an external force) in the motion of the master control magnet 161 the mutual magnetic flux (field) lines MF1 & MF2 that pass through the coil winding 35 and in FIG. 2B it is shown that the mutual magnetic flux (field) lines MF1 & MF2 are aligned at right angles (−90 degrees) to the coil wires so that there is maximum induced voltage felt at the coil terminals 35T in accordance with Faraday's Law;

$$\in = -N\frac{\Delta\Phi}{\Delta t} = -N\frac{\Delta(BA\cos\theta)}{\Delta t} \qquad \text{Eq. 5}$$

$\in$ the induced voltage at the coil terminals 35T and − (the minus sign) indicates any induced current in a coil will result in a magnetic flux that is opposite to the original changing flux.

N The number of turns in the coil winding 35.

$$\frac{\Delta(BA\cos\theta)}{\Delta t}$$

BA is the product magnetic field (B) times the area (A)
That changes in a time differential range.

In FIG. 2A & FIG. 2B first master control rotatable magnet 161 disposed within its enclosure 9 with its intrinsic residual magnetic field contributes in pairing of attractive magnetic poles, by magnetic attraction of opposite magnetic poles, a first mutual magnetic field (static) MF1 (at rest with no motion applied to any of the three in-line magnets) and this first mutual magnetic field MF1 is established with first master control magnet 161 and second magnet 163 acting as a servant (magnetically coupled) rotatable magnet. A second mutual magnetic field (static) MF2 (at rest with no motion applied to any of the three in-line magnets) and this second mutual magnetic field MF2 is established with second acting as a servant (magnetically coupled) rotatable magnet 163 and third magnet 165 acting as a servant (magnetically coupled) rotatable magnet and its intrinsic residual magnetic field contributes in pairing attractive magnetic poles, by magnetic attraction of opposite magnetic poles, a second mutual magnetic field (static) MF2 (at rest with no motion applied to any of the three in-line magnets).

FIG. 2A shows the mutual mechanical force Fm1 (measured in Newtons) that exists between the first magnet 161 and second magnet 163 because of the magnetic attraction of the first and second magnets; and shows the mutual mechanical force Fm2 (measured in Newtons) that exists between the second magnet 163 and the third magnet 165 because of the attraction of the second and third magnets.

In the side view of FIG. 3A the three elongated rectangular bar magnets that are diametrically poled 153, 155, 157 are shown disposed within their encapsulating non-magnetic enclosures 91, 32, 315 that have axles of rotation 111, 51, 171 respectively and are disposed on each side of the non-magnetic enclosures 91, 32, 315. In a rest state, which is the case in FIG. 3A, there are mutual magnetic flux lines that emanate from the North Pole N1 of first magnet that is the rotatable master control magnet 153 and is disposed within its enclosure 91 to the South Pole S2 of second servant [magnetically coupled] rotatable magnet 155 and is disposed within its enclosure 32. The North Pole N2 of second servant [magnetically coupled] magnet 155 has its mutual magnetic flux lines that emanate from the second magnet's North Pole N2 to the South Pole S2 of third magnet 157. In addition, it is recognized that there is a set of two mutual forces of physical attraction measured in Newtons. The first mutual attraction physical force Fm1 is between first magnet 153 and the second magnet 155; and the second mutual attraction physical force Fm2 is between second magnet 155 and third magnet 157.

FIG. 3B is a top view showing the in-line arrangement of the three-rotatable elongated rectangular bar magnets 153, 155, 157. First magnet 153 is disposed within its enclosure 91 and the enclosure has a set of axles in-line with the first magnet's imaginary reference axis AX1 where on each side of each of the three in-line magnets there exists three individual imaginary reference axis AX1, AX2, & AX3, where there is the North Pole on one side of each magnet and the South Pole on the opposite side of each magnet; as shown in FIG. 3A & FIG. 3B.

In FIG. 3A & FIG. 3B the coil winding 35 (on a coil bobbin) is illustrated and the mutual magnetic flux (field) lines MF1 & MF2 pass through each of the three in-line magnets 153, 155, 157; and when any motion is initiated by a disturbance (movement, triggering by an external force) in the motion of the master control magnet 153 the mutual magnetic flux (field) lines MF1 & MF2 that pass through the coil winding 35 and in FIG. 3B it is shown that the mutual magnetic flux (field) lines MF1 & MF2 are aligned at right angles (~90 degrees) to the coil wires so that there is maximum induced voltage felt at the coil terminals 35T in accordance with Faraday's Law;

$$\in = -N\frac{\Delta\Phi}{\Delta t} = -N\frac{\Delta(BA\cos\theta)}{\Delta t} \qquad \text{Eq. 6}$$

$\in$ the induced voltage at the terminals 35T and − (the minus sign) indicates any induced current in a coil will result in a magnetic flux that is opposite to the original changing flux.

N The number of turns in the coil winding 35.

$$\frac{\Delta(BA\cos\theta)}{\Delta t}$$

BA is the product magnetic field (B) times the area (A)
That changes in a time differential range.

In FIG. 3A & FIG. 3B first master control rotatable magnet 153 disposed within its enclosure 91 with its intrinsic residual magnetic field contributes in pairing of attractive magnetic poles, by magnetic attraction of opposite magnetic poles, a first mutual magnetic field (static) MF1 (at rest with no motion applied to any of the three in-line magnets) and this first mutual magnetic field MF1 is established with first master control magnet 153 and second magnet 155 acting as a servant (magnetically coupled) rotatable magnet. A second mutual magnetic field (static) MF2 (at rest with no motion applied to any of the three in-line magnets) and this second mutual magnetic field MF2 is established with second acting as a servant (magnetically coupled) rotatable magnet 155 and third magnet 157 acting as a servant (magnetically coupled) rotatable magnet and its intrinsic residual magnetic field contributes in pairing attractive magnetic poles, by magnetic attraction of opposite magnetic poles, a second mutual magnetic field (static) MF2 (at rest with no motion applied to any of the three in-line magnets).

FIG. 3A shows the mutual mechanical force Fm1 (measured in Newtons) that exists between the first magnet 153 and second magnet 155 because of the magnetic attraction of the first and second magnets; and shows the mutual mechanical force Fm2 (measured in Newtons) that exists between the second magnet 155 and the third magnet 157 because of the attraction of the second and third magnets.

Figure 4:
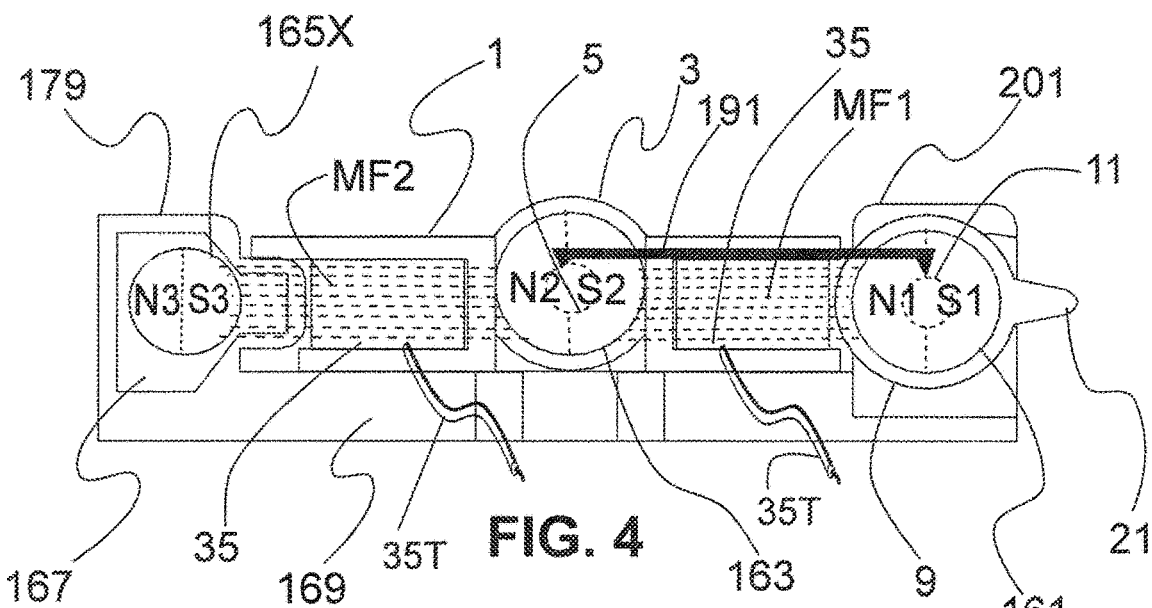
FIG. 4 shows a side cut-away view of three in-line cylinder magnets where there is a first cylinder master control magnet that is free to rotate and has a tangent toggle actuator that is under the action influence of any external force that applies force to the tangent toggle actuator.
Figure 5:
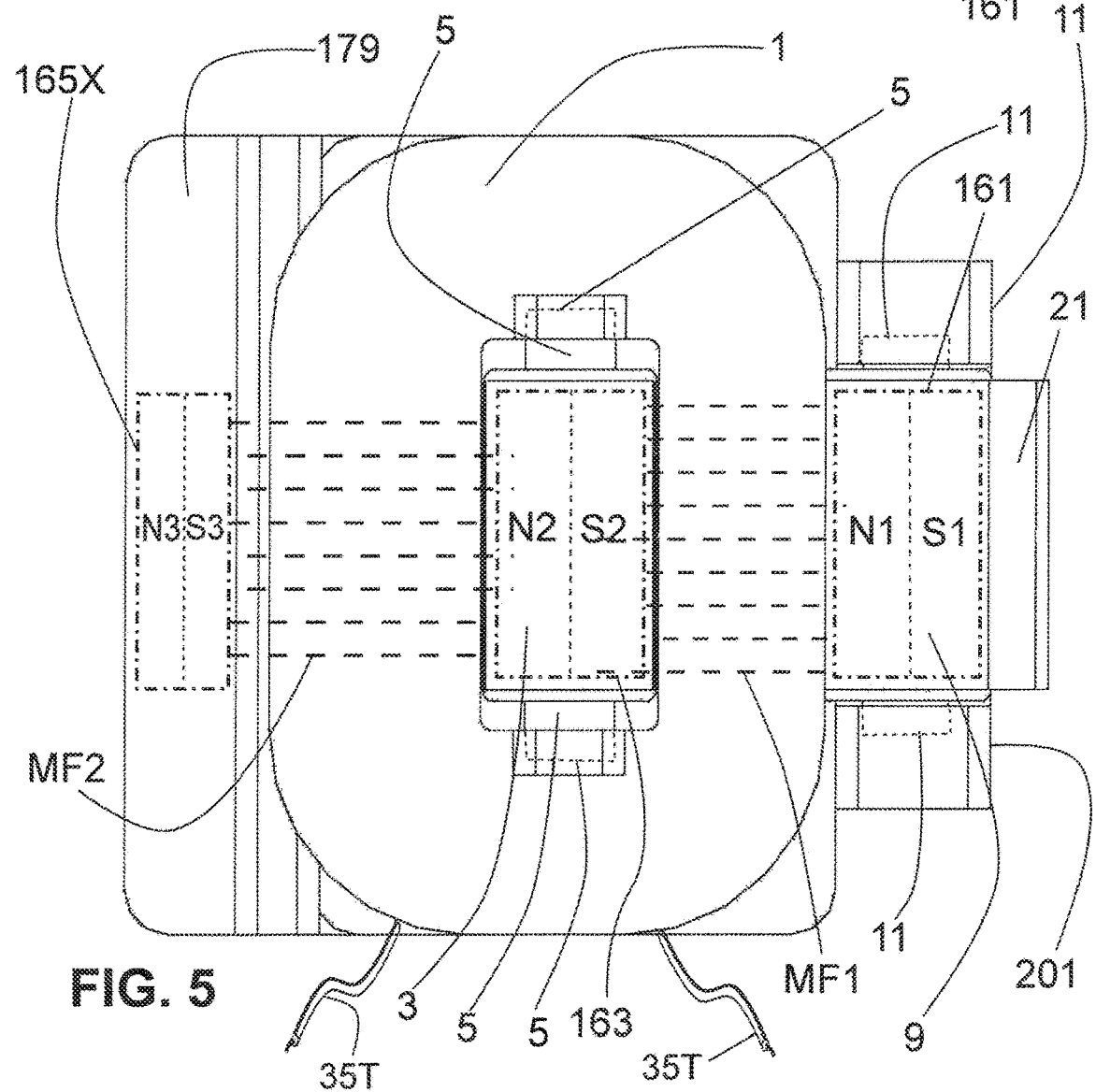
FIG. 5 shows a top view of the present invention and the placement of the magnets and referenced magnetic fields that permeate through the coil windings.

FIG. 4 is a side cutaway view of an applied commercial production embodiment of the present invention. FIG. 5 is a top view of the present invention and both accordingly illustrate a horizontal substrate 169 whose design that has two oppositely seated vertical columns 201 on each end of the horizontal substrate 169 that supports the two axles 11 that are part of the first rotatable master control magnet enclosure 9 that contains the first master control rotatable magnet 161 and since the first magnet 161 is fixed within the enclosure 9 both the first magnet enclosure 9 and the first magnet 161 are capable of rotating on the axles 11 that are supported by the two vertical columns 201. The action of rotation of the first enclosure 9 and first magnet 161 is initiated by a momentary external force applied to the toggle paddle 21.

Both FIG. 4 & FIG. 5 show the mutual magnet flux (field) lines MF1 & MF2 that permeate through the coil winding 35. Magnetic flux (field) lines MF1 exist between first magnet 161 and second magnet 163; and magnetic flux (field) lines MF2 exist between second magnet 163 and third magnet 165. In this embodiment the third freely rotatable servant (magnetically coupled) magnet 165 is disposed within a hollow chamber 167 that is part of the horizontal substrate and its hollow cross-sectional area of its total elongated volume 167 & 179 is 10-to-15% larger than the third cylindrical freely rotatable magnet 165. The larger cross-sectional area of the hollow volume 167 allows for the third magnet 165 to rotate about its lengthwise axis and is not encapsulated in any form fitting enclosure. This feature of the freely rotating third servant (magnetically coupled) magnet 165 is responsible for the Set-Reset latching feature of this generator embodiment. If the desire was to have the momentary (non-latching) feature of another generator embodiment, then the third freely rotating magnet 165 would be fixed within the volume chamber 167. In either embodiment, when the first master control magnet rotates by some applied external pushing or flicking force, a voltage is induced and is felt at the coil terminals 35T.

In FIG. 4 there is a mechanically coupled lever 191 that can be added to the present embodiment to act as a mechanically trigger coupling between the first magnet 161 and its enclosure 9 to cause the second magnet 163 and its hollow cylindrical enclosure 3 to move instantly with the first magnet 161 and its enclosure 9.

Figure 6:
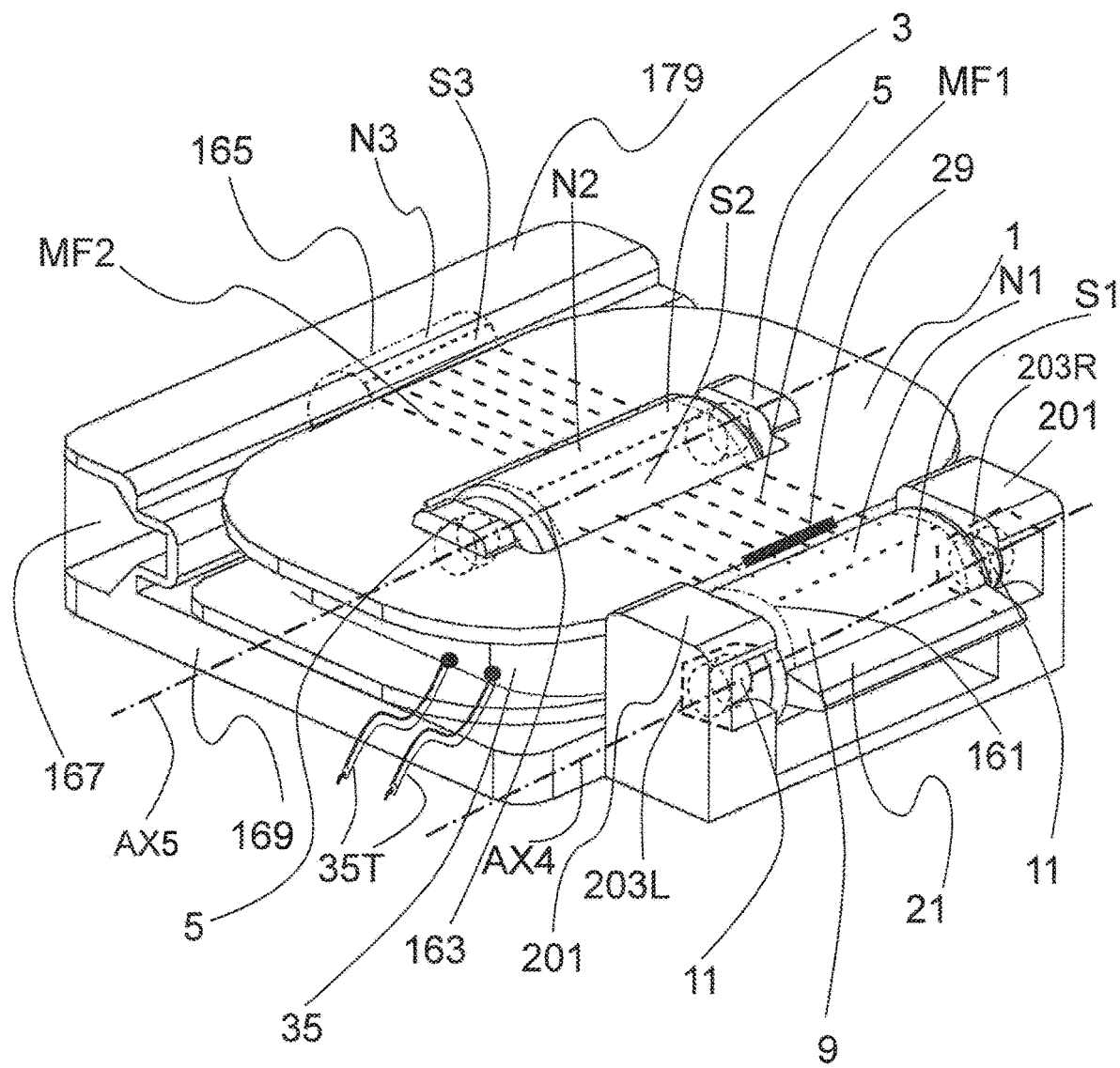
FIG. 6 shows a perspective view of the present inventions with magnetic fields between the first and second magnet and the second and third magnet.

FIG. 6 is a perspective view of the present invention is that of a commercial generator embodiment, which could be for a plurality of application embodiments and not restricted to any but can be utilized by all application germane to battery replacement in short burst wireless switching systems. The present invention is scalable up or down in size for desired designs to fit plurality of voltage and current requirements.

In the FIG. 6 embodiment, a horizontal substrate 169 that acts as a seating bed for the coil bobbin 1 with coil winding 35. This substrate 169 has two vertical support columns 201 has disposed the first freely rotatable cylindrical master control magnet 161 enclosed and fixed within a hollow cylinder 9 that has a toggle paddle 21 and is part and parcel to the hollow cylinder 9. The first magnet 161 is fixed within the hollow cylinder 9 with toggle paddle 21, which is an elongated extension parallel to the horizontal plane but not restricted to the horizontal plane; and the first magnet being fixed (not movable) within the hollow chamber 9 is free to rotate because of the hollow chamber's freedom to rotate either clockwise or counter-clockwise. The hollow cylinder 9 has disposed on opposite ends axles 11 that are supported by the two vertical columns 201 and the axles are free to rotate along their common axis of rotation AX4 in either direction within the two-vertical columns hollowed out caves 203L and 203R.

The substrate 169 in FIG. 6's embodiment acts as a mechanically secured holding bed for the coil bobbin 1 that has a plurality of wound turns of wire forming a coil winding 35. The coil bobbin has a centered hollow volume that has disposed within in it the second cylinder magnet acting as a servant (magnetically coupled) magnet 163 and this magnet 163 is fixed within a hollow cylindrical enclosure 3 and in unison both second magnet 163 and the hollow cylindrical enclosure 3 are free to rotate in either direction along their common axis of rotation AX5. Also in FIG. 6 there is the third cylinder magnet 165 acting as a servant (magnetically coupled in movement) magnet 165 his third magnet is not fixed and disposed within a hollow chamber, rather the third magnet has freedom of any rotational movement (clockwise or counter-clockwise) because it is loosely bound within the hollow volume 167 of the elongated section 179 that is abut to one side of the coil bobbin 1. On the opposite side of the coil bobbin 1 there is the first magnet 161 and cylindrical enclosure 9 that is abut to this opposite side.

By desired design convention of this embodiment in FIG. 6, the magnetic in-line pole direction in the horizontal plane is first magnet N1-S1 attractive to second magnet N2-S2 and the second magnet attractive to the third magnet N3-S3 so that as first magnet 161 rotates in a clockwise direction and the second magnet 163 instantly and magnetically coupled, rotates in the counter-clockwise direction and in turn the third magnet 165 instantly and magnetically coupled, rotates in the clockwise direction, and the sequence holds true in the converse. As this action takes place with rotation in either rotational direction, the defined mechanical action is oscillatory for a short time duration that is long enough to induce a sinusoidal voltage waveform of a diminishing voltage level felt at the coil's end terminals 35T over time, and its frequency is the reciprocal to the period during that duration. Also, when this action takes place the resultant voltage is induced by action of the changes in the movement of the mutual magnetic flux (field) lines that vary throughout the coil winding 35 at right angles to the wires in the coil winding 35.

The embodiment in FIG. 6 acts as a momentary trigger short burst energy harvesting electrical generator when the third magnet is fixed within the hollow volume section 167 of the elongated component 179 of the substrate 169. When the third magnet is free to rotate within the hollow volume section of the substrate 169, the mechanical action is a latch type of action that is the result of the first magnet 161 and enclosure 9 instantly being flicked so that the toggle paddle 21 comes to rest abut with the stop-span 29 until another flicking action is applied in the downward direction away from the stop-span 29. This action is the Set-Reset latch condition.

What is claimed is:

1. A method comprising:
   inducing a voltage between a first terminal end of a plurality of turns of wire of an electrical generator and a second terminal end of the plurality of turns of wire, the inducing caused by the rotation of a first magnet positioned within the plurality of turns of wire and configured to rotate on an axis of rotation and based on mutual magnetic flux lines generated by the first magnet, by a second magnet positioned adjacent the plurality of turns of wire in substantial alignment with the first magnet in a common horizontal plane, and by a third magnet positioned adjacent the plurality of turns of wire in substantial alignment with the first magnet and the second magnet in the common horizontal plane.

2. The method of claim 1, wherein the second magnet is configured to rotate in response to an applied force.

3. The method of claim 2, wherein the second magnet is disposed within an enclosure having a toggle paddle configured to receive the applied force.

4. The method of claim 1, wherein the plurality of turns of wire form a coil.

5. The method of claim 1, wherein the plurality of turns of wire are disposed on a bobbin.

6. The method of claim 5, wherein the bobbin is seated on a substrate.

7. The method of claim 6, wherein the substrate includes a hollow chamber, and wherein the third magnet is disposed within the hollow chamber.

8. The method of claim 1, wherein the third magnet is fixed and non-rotatable.

9. The method of claim 1, wherein the first magnet and the second magnet are each disposed within an enclosure.

10. The method of claim 1, wherein the first magnet and the second magnet are coupled to a lever and configured to move in unison in response to movement of the lever.

11. The method of claim 1, wherein at least one of the first magnet, the second magnet, and the third magnet is rectangular in shape.

12. The method of claim 1, wherein at least one of the first magnet, the second magnet, and the third magnet is cylindrical in shape.

13. The method of claim 1, wherein at least one of the first magnet, the second magnet, and the third magnet is a diametrically-poled, elongated polygon magnet, an axially-poled cylinder magnet, or an axially-poled polygon magnet.

14. The method of claim 1, wherein the third magnet is configured to maintain the first magnet and the second magnet in a locked position.

15. A method comprising:
   rotating a first magnet positioned within a plurality of turns of wire of an electrical generator about an axis of rotation; and
   inducing a voltage between a first terminal end of the plurality of turns of wire and a second terminal end of the plurality of turns of wire, the inducing caused by the rotating of the first magnet and based on mutual magnetic flux lines generated by the first magnet, by a second magnet positioned adjacent the coil in substantial alignment with the first magnet in a common horizontal plane, and by a third magnet positioned adjacent the coil in substantial alignment with the first magnet and the second magnet in the common horizontal plane.

16. The method of claim 15, wherein the first magnet and the second magnet are each disposed within an enclosure.

17. The method of claim 15, wherein the plurality of turns of wire form a coil.

18. The method of claim 15, wherein the plurality of turns of wire are disposed on a bobbin.

19. The method of claim 15, wherein at least one of the first magnet, the second magnet, and the third magnet is rectangular in shape.

20. The method of claim 15, wherein at least one of the first magnet, the second magnet, and the third magnet is cylindrical in shape.

* * * * *